United States Patent [19]

Howorth et al.

[11] 4,099,198

[45] Jul. 4, 1978

[54] PHOTOCATHODES

[75] Inventors: Jonathan Ross Howorth; Peter James Pool, both of Maldon, England

[73] Assignee: English Electric Valve Company Limited, England

[21] Appl. No.: 686,374

[22] Filed: May 14, 1976

[30] Foreign Application Priority Data

May 14, 1975 [GB] United Kingdom ............... 20241/75

[51] Int. Cl.2 ............................................ H01L 27/14

[52] U.S. Cl. ........................................ 357/30; 357/31; 357/52

[58] Field of Search .................. 428/446, 913; 357/30, 357/31

[56] References Cited

U.S. PATENT DOCUMENTS

| | | | |
|---|---|---|---|
| 3,458,782 | 7/1969 | Buck | 317/235 |
| 3,699,404 | 10/1972 | Simon | 317/235 R |
| 3,960,620 | 6/1976 | Ettenberg | 148/175 |
| 3,990,100 | 11/1976 | Mamine | 357/30 |

OTHER PUBLICATIONS

Scheer, Philips Res. Reports, 15, 1960, pp. 584–586.

*Primary Examiner*—Martin H. Edlow

[57] ABSTRACT

The input surface of a photocathode consisting of a membrane of p-type silicon is modified to improve it's sensitivity. The p-type concentration is locally increased and the surface is coated with silicon nitride.

9 Claims, 2 Drawing Figures

PHOTOCATHODES

This invention relates to photocathodes, and in particular seeks to improve the photo-sensitivity of silicon photocathodes.

According to this invention a photocathode includes a thin membrane of p-type silicon having a first major surface for receiving illumination and a second major surface from which electrons are emitted in response to the received illumination, said first major surface comprising a surface region having a locally increased concentration of p-type impurity, and being provided with an exterior surface layer of silicon nitride.

Preferably the first and second major surfaces are substantially parallel and of approximately the same size. It is usally necessary to coat the said second surface with a material which reduces its work function in order to produce what is usually termed negative electron affinity. Preferably this material is caesium oxide.

Preferably the p-type impurity is boron, and the concentration at the surface is made sufficiently great to render the surface region $p+$. The surface concentration of the boron to produce the required $p+$ condition is about $10^{20}$ per c.c., as compared to a typical bulk concentration of $5 \times 10^{18}$ per c.c. and the penetration of the $p+$ impurity into the body of the silicon membrane is preferably very shallow; typically the excess impurity concentration is negligible at depths greater than 0.1 to 0.2 $\mu$m (1 $\mu$m $= 10^{-6}$ meters).

Preferably again the $p+$ layer results from a diffision process produced from a boron oxide vapour deposition at an elevated temperature, or it can alternatively be produced by boron ion implantation.

Similarly the silicon nitride layer can be subsequently laid down by a vapour deposition process, and conveniently is produced by passing a mixture of silane gas and ammonia gas (in an inert carrier gas such as nitrogen) over the silicon membrane which is held at about 800° C.

The use of a silicon nitride layer over a $p+$ surface permits a significant increase in photo-sensitivity to be obtained for the silicon photocathode. The increase in photo-sensitivity stems from two main effects. Firstly, the silicon nitride acts as a diffussion barrier, and prevents the tendency for the surface layer of $p+$ (usually boron) to evaporate away during the usual high temperature outgassing step in the manufacturing process. Secondly, by adjusting the thickness of the silicon nitride to a desired value, the silicon nitride (which is light transmissive) behaves as an anti-reflection coating and correspondingly increases the proportion of the illumination that reaches the photocathode.

Figure 1:
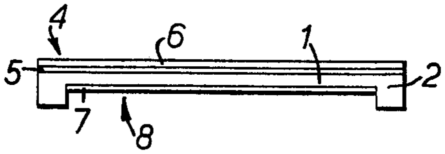
Figure 2:
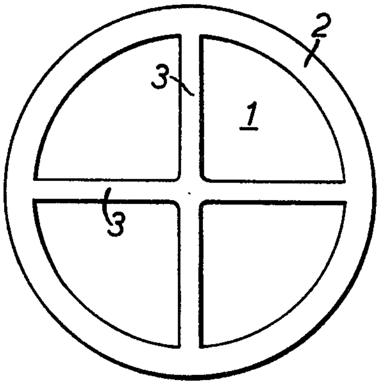

The invention is further described, by way of example, with reference to the accompanying drawings in which, FIG. 1 shows a section view through a photocathode in accordance with the present invention, and FIG. 2 shows a plan view of the same photocathode.

Referring to the drawings, a thin membrane 1 of p-type silicon is supported by a relatively thick frame 2 which is formed integrally with it. The membrane 1 can be produced from a thick single block of silicon by selectively etching a central region of one major surface 8 to leave the thick frame 2. By using an etchant which etches away the unwanted material fairly slowly, and by rotating the thick block of silicon as it is etched, a membrane having a uniform thickness can be produced.

The membrane 1 is formed integrally with the frame 2 since, typically the thickness of the membrane 1 is between 2$\mu$um and 20$\mu$m and is consequently very fragile. A thickness of 100$\mu$m for the frame 2, has been found satisfactory. If the diameter of the membrane is large, radial supports 3 may be left to provide greater mechanical strength (the radial supports are omitted from FIG. 1).

In the drawings, for the sake of clarity the thickness of the membrane 1 is greatly exaggerated in relation to its diameter. The p-type silicon contains a boron concentration of about $5 \times 10^{18}$ per c.c., and in the region of a first major surface 4 there is provided a surface region 5 which is $p+$, the boron concentration at the surface being about $10^{20}$ to $20^{22}$ per c.c. A layer 6 of silicon nitride is provided over the $p+$ surface region 5.

The $p+$ surface region 5 can be produced by any convenient method, and in particular it can be produced by conventional vapour deposition of boron oxide onto the first major surface 4, the boron diffusing from the oxide a short distance into the membrane 1. The surface region 5 is relatively shallow, and the excess $p+$ concentration of boron is very small at distances of 0.1 to 0.2$\mu$m and greater from the surface. Vapour deposition and diffusion processes are now so well known it is not thought necessary to describe them in greater detail.

The layer 6 of silicon nitride is also laid down by vapour deposition. Although the production of a layer of silicon nitride is not as easy as, say, the growth of silicon dioxide, a number of known methods do exist, of which the most satisfactory is probably a chemcial vapour deposition process. In one example of this method a mixture of silane and ammonia in a carrier gas of nitrogen is passed over the surface of the membrane 1 at an elevated temperature (about 800°C is satisfactory). The silane and ammonia concentrations in the nitrogen are typically 0.3% and 0.5% respectively. The deposition in continued until a silicon nitride layer of about 0.1 to 0.2$\mu$m thickness has been built up. The precise thickness is dependent on the wavelengths of light with which the photocathode is to be used since the layer of silicon nitride is arranged to behave as an anti-reflection coating.

The photocathode is subsequently outgassed at a temperature of about 1200° C and then a layer 7 of caesium oxide is laid down on a second major surface 8. The presence of the caesium reduces the work function of the silicon surface 8 and produces a negative electron affinity; that is to say, free electrons generated within the silicon membrane 1 are ejected through the layer 7 of caesium oxide. The presence of the silicon nitride layer 6 playes a very important part during the high temperature outgassing step mentioned earlier since it effectively prevents evaporation of the $p+$ layer which would otherwise occur.

In operation, light is incident on the surface of the silicon nitride layer 6, which, because it behaves as an anti-reflection coating causes a greater proportion of the light to reach the interior of the silicon membrane 1, than would otherwise be the case. As already mentioned the thickness of the layer of silicon nitride 6 is chosen with regard to its anti-reflection properties and in order to keep the light attenuation to a minimum the optical thickness is preferably a quarter wavelength of the incident light, or the mean wavelength if a band of wavelengths are used (note that it is the wavelength of light in the silicon nitride that must be used to calculate the thickness). For an anti-reflection coating which is intended to be most effective at the near infra-red (wavelength — 0.8μm) a thickness of about 0.11μm is satisfactory for the silicon nitride layer, assuming that its refractive index is about 2.

The incident light generates photo-electrons within the silicon membrane 1, and the $p+$ gradient reduces the problem of surface recombination and the doping gradient accelerates the electrons towards the surface 8 of the photocathode where the reduced work function at the surface enables the electrons to be emitted.

It is believed that use of the present invention permits an increase in the photo-senstivity by a factor of about 3; a factor of 2 improvement being attributable to the preservation of the $p+$ surface by the layer of silicon nitride, and a factor of 1.5 improvement resulting from the decrease in reflectivity at the surface.

We claim:

1. A photocathode including a membrane of p-type silicon having a first major surface for receiving illumination and a second major surface from which electrons are emitted in response to the received illumination, said first major surface comprising a surface region having a $p+$ impurity concentration, an exterior surface layer of silicon nitride overlying said surface region, and a coating on said second major surface of a material which reduces its work function.

2. A photocathode as claimed in claim 1 and wherein the first and second major surfaces are substantially parallel and of approximately the same size.

3. A phtocathode as claimed in claim 1 and wherein the coating material is caesium oxide.

4. A photocathode as claimed in claim 1 and wherein the p-type impurity is boron.

5. A photocathode as claimed in claim 4 and wherein the $p+$ layer resuls from a diffusion process produced from a boron oxide vapour deposition at an elevated temperature.

6. A phtocathode as claimed in claim 4 and wherein the $p+$ layer is produced by boron ion implantation.

7. A photocathode as claimed in claim 1 wherein the silicon nitride layer is laid down by vapour deposition, and is produced by passing a mixture of silane gas and ammonia gas in an inert carrier gas over the silicon membrane which is held at about 800°C.

8. A photocathode as defined in claim 4 wherein said surface region is rendered $p+$ by a boron concentration in the range $10^{20}$–$10^{1022}$ per c.c. as compared with a boron concentration of the membrane in the order of $5 \times 10^{18}$ per c.c., said surface region having excess impurity concentration which is negligible at depths greater than 0.1 - 0.2μm.

9. A photocathode as defined in claim 8 wherein said membrane is of a thickness in the range 2 - 20μm.

* * * * *